United States Patent [19]

Whiteside et al.

[11] Patent Number: 4,694,244
[45] Date of Patent: Sep. 15, 1987

[54] APPARATUS FOR RANDOM REPETITIVE SAMPLING

[75] Inventors: Laura Whiteside; Thomas K. Bohley, both of Colorado Springs, Colo.

[73] Assignee: Hewlett Packard Company, Palo Alto, Calif.

[21] Appl. No.: 832,107

[22] Filed: Feb. 21, 1986

[51] Int. Cl.⁴ .................. G01R 13/20; H03M 1/06
[52] U.S. Cl. ..................... 324/121 R; 340/347 SH
[58] Field of Search ............ 324/121 R, 77 A; 328/150, 151; 364/487; 340/347 SH

[56] References Cited
U.S. PATENT DOCUMENTS 4,540,938 9/1985 Bruce .............................. 324/121 R
4,578,667 3/1986 Hollister ...................... 340/347 SH Primary Examiner—Reinhard J. Eisenzopf
Assistant Examiner—Vinh P. Nguyen
Attorney, Agent, or Firm—Karl E. Bring; Douglas A. Kundrat

[57] ABSTRACT

Methods and apparatus for random repetitive sampling in digital oscilloscopes is disclosed using a psuedo-random noise generator to vary randomly the beginning of a search for a trigger event to enable the acquiring of data which has no gaps.

1 Claim, 10 Drawing Figures

APPARATUS FOR RANDOM REPETITIVE SAMPLING

BACKGROUND OF THE INVENTION

This invention relates to digital oscilloscopes in general, and more specifically to apparatus and method for acquiring data using random repetitive sampling.

A digital oscilloscope samples an analog waveform at discrete points in time, converts the analog values to digital values and stores these values and the corresponding sample times in a memory. The oscilloscope display is a plot of the digital samples as shown, for example, in FIG. 1. The display accuracy depends on the density of the sample points relative to the period and rise time of the sampled waveform. In single shot sampling oscilloscopes, such as the Hewlett Packard Company Model 54200A/D, the density is limited by the maximum sample rate of the oscilloscope. Repetitive sampling oscilloscopes, such as the Hewlett Packard Company Model 54100A/D, use random repetitive sampling to increase the display density of a sampled repetitive waveform beyond the maximum sample rate. In random repetitive sampling, samples taken during several acquisition periods are combined relative to common trigger points to form one displayed waveform. The display density is increased since the acquisition periods overlap relative to identically located trigger points. FIGS. 2A-C show a display after one, two, and multiple acquiaitions, respectively.

If, in random repetitive sampling, the waveform period is shorter than the oscilloscope sample clock period, and the search for a common reference point for the acquisition period begins at a time synchronized to the sample clock, then the displayed information will contain gaps as shown in FIG. 3. Gaps occur because a trigger event will always be located within one waveform period for repetitive waveforms. Phase shifting the sample clock was a prior art solution used in the Hewlett Packard 54100A/D. This solution was bulky, expensive, slow, and required special software. In addition, intermittent display gaps appeared.

SUMMARY OF THE INVENTION

In accordance with the illustrated preferred embodiment of the present invention, a random repetitive sampling oscilloscope uses a pseudo-random noise source to vary randomly the relationship of the trigger event to the sample clock. The oscilloscope fills in the gaps with acquired data and displays an improved representation of the waveform by finding the trigger event at a truly random time with respect to the sample clock. The oscilloscope in accordance with the invention is both inexpensive and efficient.

DETAILED DESCRIPTION OF THE PREFERRED EMBODIMENT

Figure 4:
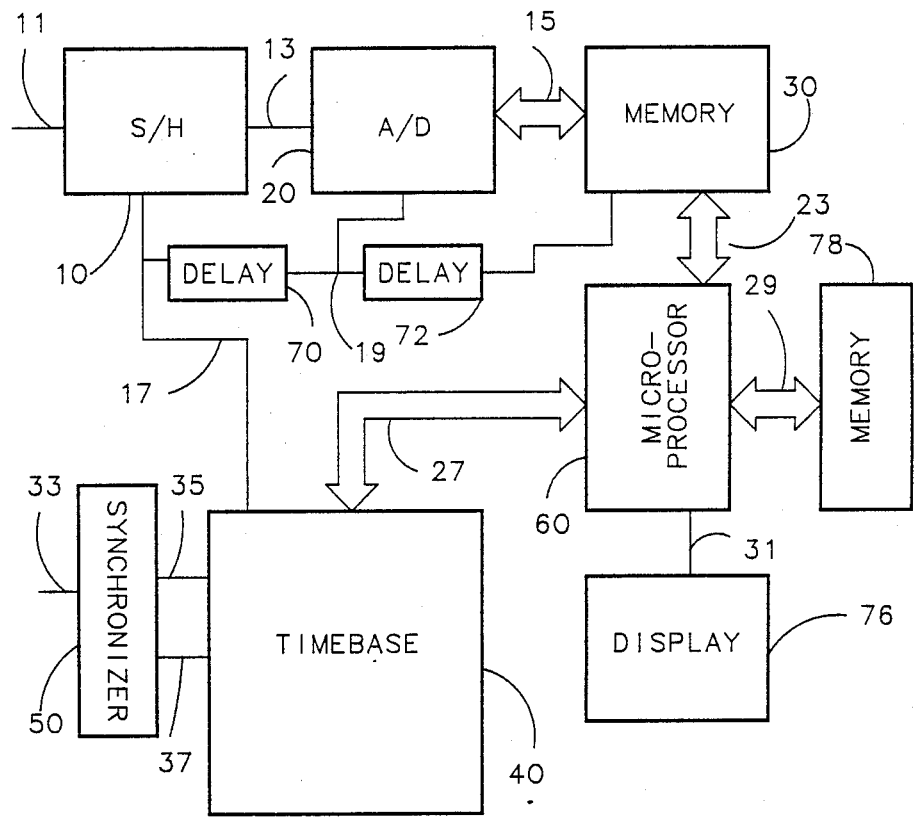
FIG. 4 is a block diagram of a digital oscilloscope in accordance with the preferred embodiment of the present invention.

FIG. 4 is a block diagram of an overview of a random repetitive sampling digital oscilloscope in accordance with the preferred embodiment of the present invention. The oscilloscope takes samples about a waveform trigger point. Several acquisitions, or sets of samples, are taken and compiled, using the trigger point of each acquisition period as a common reference point. An analog sample-and-hold 10 (sampler 10), an analog-to-digital converter 20 (converter 20), and a memory 30 are used for a single acquisition. Sampler 10 samples a waveform on each leading edge of a sample clock signal generated by a timebase 40. The analog samples are converted by converter 20 and the digital samples are then stored in memory 30. A delay 70 compensates the sample clock signal to converter 20 for delays inherent in sampler 10. Likewise, a delay 72 compensates the sample clock signal to memory 30 for delays inherent in converter 20. A microprocessor 60 determines the address for each digital value stored in memory 30. Single acquisitions stored in memory 30 are compiled in a memory 78 by microprocessor 60 for later viewing on a display 76 as a single displayed waveform. The timebase 40 and a synchronizer 50 control when each acquisition is taken and where the location of the acquisition is relative to the trigger point.

The timebase 40 is used to control sampling and trigger point recognition during an acquisition. Sampling begins prior to the start of an acquisition period. The trigger point is when a user-defined trigger event, such as a rising edge, occurs while the waveform is being examined by the oscilloscope for a trigger event. The user defines the portion of the waveform to be sampled in reference to the trigger point by specifying a pretrigger delay to occur before examining the waveform for a trigger event, and a post-trigger delay to occur after detection of a trigger event. The end of the post-trigger delay is the end of the acquisition period, and sampling stops then. Samples taken during pretrigger delay, the trigger event search, and the post-trigger delay comprise one acquisition and are retained by the oscilloscope for analysis. The maximum number of samples which can be retained by the oscilloscope for one acquisition is limited by the maximum size of memory 30.

Figure 5:
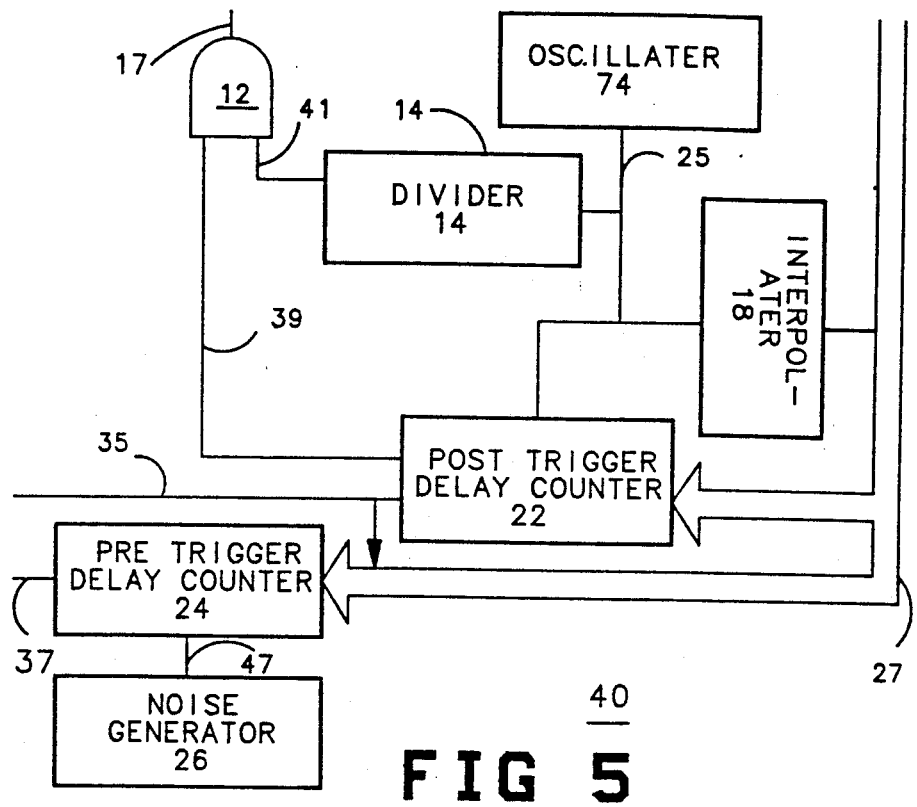
FIG. 5 is a block diagram of the timebase shown in FIG. 4.
Figure 6:
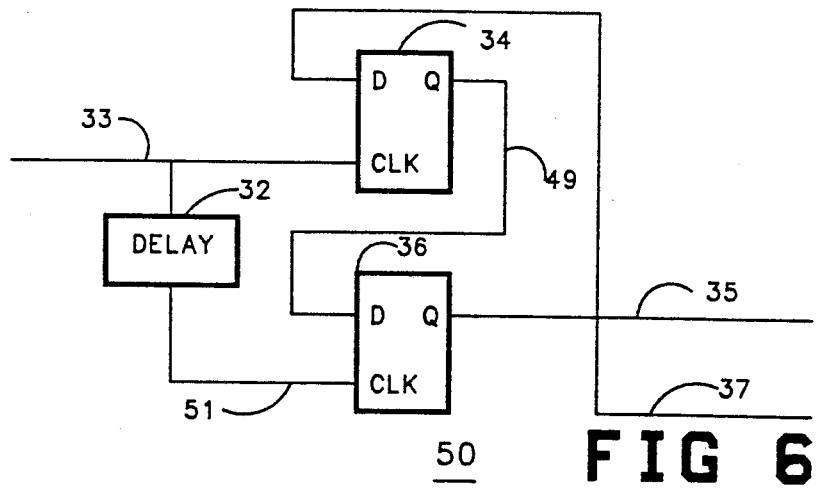
FIG. 6 is a block diagram of the synchronizer shown in FIG. 4.

FIG. 5 shows an expanded block diagram of the timebase 40 shown in FIG. 4. A pretrigger delay counter 24 and a post-trigger delay counter 22 are initialized to the user-determined pretrigger delay and post-trigger delay by microprocessor 60. At the start of a single acquisition, microprocessor 60 enables counter 24 which counts clock leading edges appearing on line 47 from a psuedo-random noise generator 26 (generator 26).

Generator 26 generates a series of pulses of random duration, each pulse having a minimum duration. In this embodiment, generator 26 is a National Semiconductor MM5437, which generates a series of pulses, each pulse having a minimum duration of 1.5 microseconds. The pretrigger delay counter 24 is initialized to the user-determined value by assuming all the pulses are of the minimum duration, insuring that the pretrigger delay required by microprocessor 60 is minimally met, and that the time the search for a trigger event begins is not dependent on the sample clock or some other clock.

Figure 1:
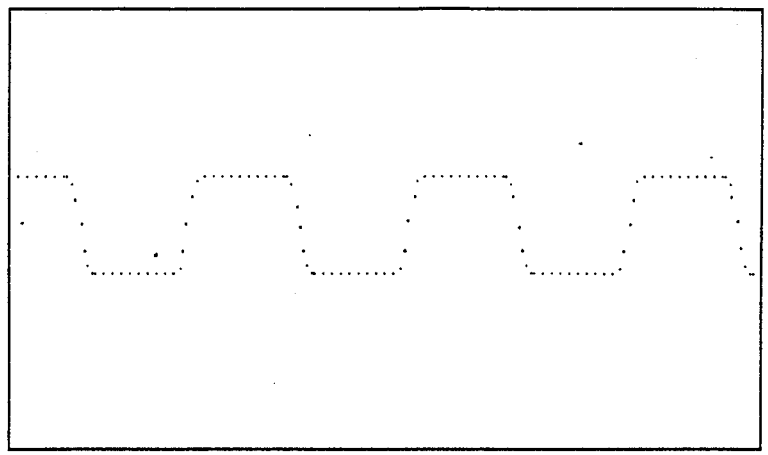
FIG. 1 shows a display from a typical prior art digital oscilloscope.
Figure 2A:
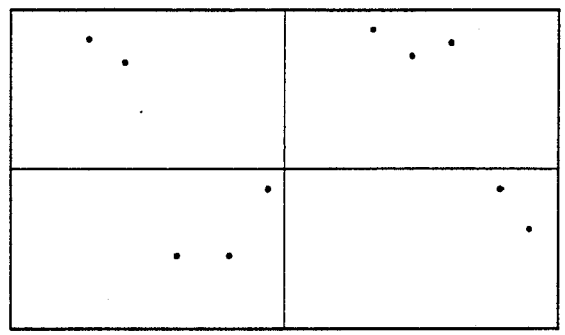
FIG. 2A-C show examples of different stages of random repetitive sampling in a prior art oscilloscope.
Figure 2B:
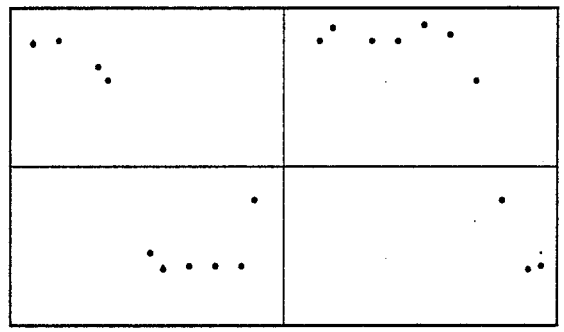
Figure 2C:
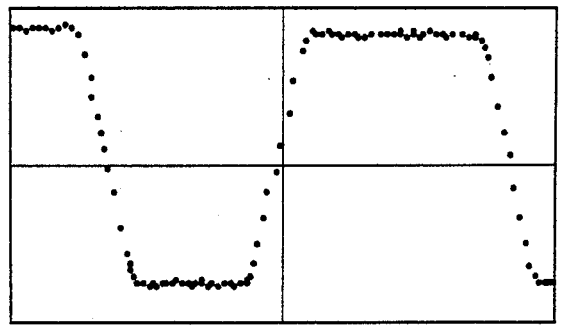
Figure 3:
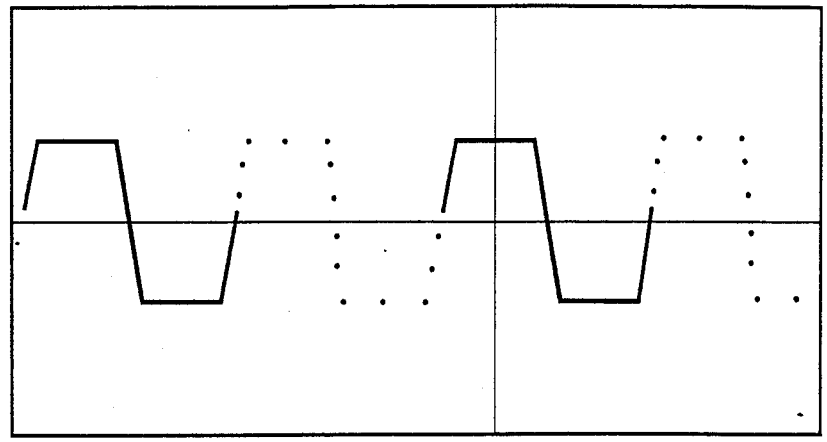
FIG. 3 shows an example of the typical waveform having missing gaps generated by a prior art oscilloscope.
Figure 7:
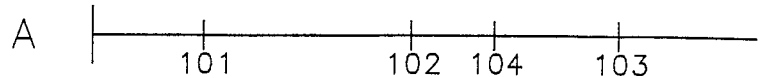
FIG. 7A-C, are timing diagrams for three different acquisitions showing sample clock occurences and the trigger point for each acquisition.
Figure 7:
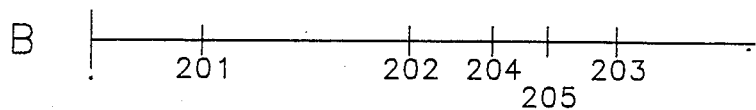
Figure 7:
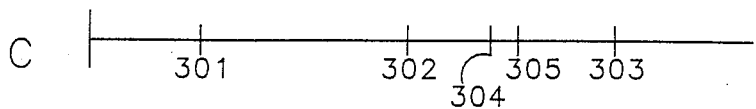

If the sample clock or some other clock was used to clock counter 24, the result would be the problem shown in FIG. 3. In this case, the time the trigger search begins is dependent on the sample clock, and the trigger search will begin at the same point relative to the sample clock for each acquisition. For this example, the time was chosen to be from time 102 to time 104, as shown in FIG. 7A. The problem occurs for any chosen set of time. In FIG. 7A, representing a short period of time about the trigger point during an acquisition period, rising edges of the sample clock occur at time 101, time 102, and time 103. The trigger signal has a period shorter than the sample clock period. The search for a trigger event begins at time 104 and a trigger is found immediately at time 104. In FIG. 7B, representing the same period of time for a second acquisition period, the rising edges of the sample clock occur at time 201, time 202, and time 203. The search for a trigger event begins at the same time with respect to the sample clock which is time 204. The trigger event is located at the end of the trigger signal period, which is time 205. If the trigger event had been later in time than time 205, the oscilloscope would have found the trigger occuring one trigger signal period earlier, as in FIG. 7A at time 104. In FIG. 7C, representing the same period of time for a third acquisition period, the rising edges of the sample clock occur at time 301, time 302, and time 303. The search for a trigger event begins at the same time with respect to the sample clock which is time 304. The trigger event is found in the middle of the trigger signal period at time 305.

Figure 8:
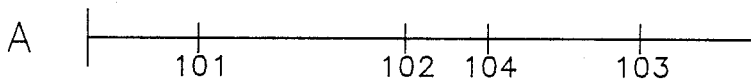
FIG. 8A-D are timing diagrams from FIG. 7A-C aligned along the common trigger point, and a timing diagram for the combined acquisitions.
Figure 8:
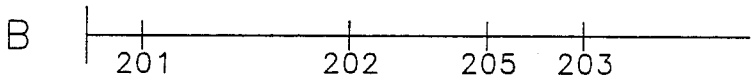
Figure 8:
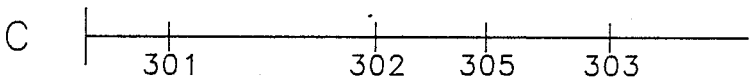
Figure 8:
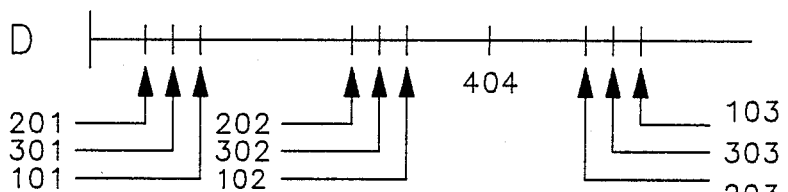

FIG. 8A-D shows the acquisitions from FIG. 7A-C combined relative to the trigger point for each. FIGS. 8A, 8B, and 8C show the acquisitions from FIG. 7A, 7B, and 7C respectively adjusted so that the common reference points are aligned. FIG. 8D shows the compilation of the acquisitions in FIG. 8A, FIG. 8B, and FIG. 8C. The trigger points for each acquisition, occuring at time 104, time 205, and time 305 are combined and shown at time 404 in FIG. 8D. Consequently, the rising edges of the sample clocks for each acquisition are combined as shown in FIG. 8D. The samples acquired will fit into windows of time the same size as the period of the waveform under test, for example time 201 to time 101, time 202 to time 102, and time 203 to time 103 as shown in FIG. 8D. The time from the front of a window to the front of the next window will be the time between samples, for example time 201 to time 202, time 202 to time 203, time 301 to time 302, time 102 to time 103 as shown in FIG. 8D. If the period of the signal under test is less than the period of the sample clock, gaps will appear between the windows of time, for example time 101 to time 202, and time 102 to time 203 as shown in FIG. 8D. If the period of the waveform is equal to or greater than the period of the sample clock, the windows of time containing the acquired samples will overlap, and no gaps will appear.

In FIG. 4, the timebase 40 is connected to a synchronizer 50 which signals the timebase 40 when a trigger event occurs in the signal under test. When the counter 24 counts down to zero from the user-determined value, an enable signal is sent to the synchronizer 50. The synchronizer, when enabled, searches for a trigger event on the waveform under test. The appearance of a waveform rising edge, the trigger event for this embodiment, causes D-type flip-flop 34 to signal D-type flip-flop 36. The trigger event on line 33 will also appear on a line 51 after passing through a hardware delay block 32. The D-type flip-flop 36 will signal the counter 22 on line 35 with an enable signal when line 49 has a signal and a signal appears on line 51. Two flip-flops are used to avoid problems with race conditions.

The enable signal on line 35 enables the counter 22, shown in FIG. 5. Counter 22 counts clock leading edges from a divider 14 which is used to divide the clock pulse form oscillater 74 to create the sample clock signal. When counter 22 counts down to zero from the user-determined value, a control enable signal is sent to an AND gate 12 (gate 12).

Counter 22 connected to gate 12 is used to enable and disable the sampler 10. When gate 12 is enabled by counter 22, the sample clock pulses from divider 14 are transfered to sampler 10. When gate 12 is disabled by counter 22, no clock pulses reach sampler 10 and it stabilizes in a nonsampling state. Converter 20 and memory 30 also are inactive.

A hardware interpolater 18 (interpolater 18) is connected to microprocessor 60 by bus 27 and to oscillater 74 by line 25. Using clock pulses from oscillater 74 and signals signifying trigger event locations from synchronizer 50, interpolater 18 determines with high resolution when the trigger event occurs relative to the samples taken. In the preferred embodiment, the interpolation is accomplished by using a 200:1 stretcher. In the stretcher, a capacitor is charged for a period of time equal to the time between the trigger event and the next sample clock pulse. The capacitor is then discharged at a rate 200 times slower than the rate at which it charged, and the time required to discharge the capacitor is measured by the oscillator clock, allowing a high resolution measurement. This method of interpolation is well known in the prior art. The trigger point, is the common reference point for compiling different acquisitions when random repetitive sampling is used.

We claim:

1. Apparatus for acquiring data using random repetitive sampling in a digital oscilloscope comprising:
   sampling means having a clock input, a signal input having an analog value, and an output for setting the output to the analog value of the signal input on rising edges occuring on the clock input;
   converter means connected to the sampling means for converting the sampled analog values to digital values,
   first memory means connected to converter means for storing digital values,
   timebase means connected to sampling means for creating clock signals, counting minimum pretrigger delays, randomizing trigger event searches with respect to rising edges occuring on the clock input of the sampling means, counting post-trigger delays and controlling sampling,
   microprocessor means connected to said first memory means for controlling said timebase means, said first memory means, second memory means, and display means,
   said second memory means connected to said microprocessor means for storing compilations of digital values stored in said first memory means,
   said display means connected to said microprocessor means for displaying digital values stored in said second memory means,
   synchronizer means connected to said timebase means for locating user-determined trigger events.

* * * * *